(12) United States Patent
Huang

(10) Patent No.: US 9,984,980 B2
(45) Date of Patent: May 29, 2018

(54) MOLDED LEAD FRAME DEVICE

(71) Applicant: Chang Wah Technology Co., Ltd., Kaohsiung (TW)

(72) Inventor: Chia-Neng Huang, Kaohsiung (TW)

(73) Assignee: CHANG WAH TECHNOLOGY CO., LTD., Kaohsiung (TW)

( * ) Notice: Subject to any disclaimer, the term of this patent is extended or adjusted under 35 U.S.C. 154(b) by 0 days. days.

(21) Appl. No.: 15/482,039

(22) Filed: Apr. 7, 2017

(65) Prior Publication Data
US 2018/0096953 A1  Apr. 5, 2018

(30) Foreign Application Priority Data
Sep. 30, 2016 (TW) .............................. 105131719 A

(51) Int. Cl.
*H01L 23/48* (2006.01)
*H01L 23/00* (2006.01)
*H01L 23/495* (2006.01)
*H01L 21/48* (2006.01)
*H01L 23/498* (2006.01)

(52) U.S. Cl.
CPC ........ *H01L 23/562* (2013.01); *H01L 21/4821* (2013.01); *H01L 21/4828* (2013.01); *H01L 21/4839* (2013.01); *H01L 23/49503* (2013.01); *H01L 23/49537* (2013.01); *H01L 23/49541* (2013.01); *H01L 23/49548* (2013.01); *H01L 23/49558* (2013.01); *H01L 23/49838* (2013.01); *H01L 24/48* (2013.01); *H01L 2224/4805* (2013.01); *H01L 2224/48245* (2013.01)

(58) Field of Classification Search
CPC .............. H01L 23/562; H01L 21/4821; H01L 21/4828; H01L 21/4839; H01L 23/49838; H01L 23/49503; H01L 23/49537; H01L 23/49558; H01L 23/49541; H01L 23/49548; H01L 24/48; H01L 2224/4805
See application file for complete search history.

(56) References Cited

U.S. PATENT DOCUMENTS

2013/0256854 A1* 10/2013 Kobayashi ........ H01L 23/49568
257/675

* cited by examiner

*Primary Examiner* — Fei Fei Yeung Lopez
(74) *Attorney, Agent, or Firm* — DLA Piper LLP (US)

(57) ABSTRACT

A molded lead frame device includes a plurality of lead frame units and a molding layer. Each of the lead frame units includes an array of leads. Each of the leads includes a die-connecting portion and a terminal portion that extends downwardly from the die-connecting portion. The molding layer embeds the die-connecting portions of the lead frame units and has spaced apart longitudinal and transverse sections intersecting each other and separating the lead frame units from each other.

6 Claims, 9 Drawing Sheets

MOLDED LEAD FRAME DEVICE

CROSS-REFERENCE TO RELATED APPLICATION

This application claims priority of Taiwanese Invention Patent Application No. 105131719, filed on Sep. 30, 2016.

FIELD

The disclosure relates to a lead frame device, and more particularly to a molded lead frame device with a molding layer at least partially embedding lead frame units and separating the lead frame units from each other.

BACKGROUND

Referring to FIG. 1, a method for manufacturing a conventional quad flat no-lead (QFN) package is illustrated. First, a metal sheet made of copper, an iron-nickel-based alloy, or copper-based alloy is etched to remove an unnecessary portion to form a plurality of lead frame devices 1 (only one is shown in FIG. 1). Each of the lead frame devices 1 includes a pair of spaced-apart longitudinal sections 111, a pair of spaced-apart transverse sections 112 connected between the longitudinal sections 111, and at least one lead frame unit 12. The lead frame unit 12 includes a die pad 13 surrounded by the longitudinal sections 111 and the transverse sections 112, and a plurality of spaced-apart leads 14 extending from the longitudinal sections 111 and the transverse sections 112 toward the die pad 13.

When the lead frame devices 1 are to be used as chip carriers, semiconductor chips (not shown) are respectively adhered to top surfaces of the die pads 13, and then wires are connected between each of the semiconductor chips and corresponding ones of the leads 14 using wire bonding techniques. Thereafter, the die pads 13, the semiconductor chips, the leads 14, and the wires are packaged together to form a plurality of the QFN packages. Subsequently, the QFN packages are singularized by dicing along scribing lines (only one is shown in FIG. 1 as an imaginary line).

Referring to FIG. 2, a method for manufacturing a conventional grid quad flat no-lead (GQFN) package is illustrated. First, a top surface of a metal sheet 10 is etched to remove an unnecessary portion so as to form a first etched pattern unit 121. The first etched pattern unit 121 includes a plurality of lead frame devices (only one is shown in FIG. 2) and a first gap 141 thereamong, each of the lead frame devices including a die pad 13, a lead frame unit 12 surrounding the die pad 13 and a second gap 142 between the die pad 13 and the lead frame unit 12. Then, chips 15 are respectively adhered to the die pads 13 of the lead frame devices of the first etched pattern unit 121 and connected to the lead frame units 12 through wire bonding techniques, followed by applying an encapsulating layer 17 on the top surface of the metal sheet 10 to encapsulate the chips 15, wires 16 and the first etched pattern unit 121 to encapsulate the chips 15, the wires 16 and the lead frame devices and fill the first gap 141 and the second gaps 142. Then, the metal sheet 10 is etched from a bottom surface that is opposite to the first surface to remove an unnecessary portion so as to form a second etched pattern unit 122 that corresponds in position to the first etched pattern unit 121 and that includes die support portions respectively extending from the die pads 13, lead extension portions respectively extending from the lead frame units 12, a third gap 143 in spatial communication with the first gap 141 and fourth gaps 144 in spatial communication with the second gaps 142. Subsequently, an insulating layer 18 is applied to fill the third and fourth gaps 143, 144, followed by dicing along the third gap 143 in a direction shown by bold arrows shown in FIG. 2 to produce a plurality of single QFN packages. Since the leads 14 are separately formed in the first etched pattern unit and connected to each other with the encapsulating layer 17 and the insulating layer 18. Formation of the longitudinal sections and the transverse sections 111, 112 as mentioned in the conventional QFN package of FIG. 1 is replaced with formation of the encapsulating layer 17 and the insulating layer 18. Hence, the QFN packages can be obtained by dicing the encapsulating layer 17 and the insulating layer 18 filled in the first and third gaps 141, 143 without damage to the metal sheet. However, etching the bottom surface of the metal sheet is conducted posterior to wire-bonding of the leads 14 to the chips 15 and application of the encapsulating layer 17. It cannot be anticipated to have no adverse effect on the chips 15.

SUMMARY

Therefore, an object of the disclosure is to provide a molded lead frame device that can alleviate at least one of the drawbacks of the prior art.

According to an aspect of the disclosure, a molded lead frame device includes a plurality of lead frame units, and a molding layer.

Each of the lead frame units includes an array of leads. Each of the leads includes a die-connecting portion and a terminal portion that extends downwardly from the die-connecting portion.

The molding layer embeds the die-connecting portions of the lead frame units and has spaced apart longitudinal and transverse sections intersecting each other and separating the lead frame units from each other.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
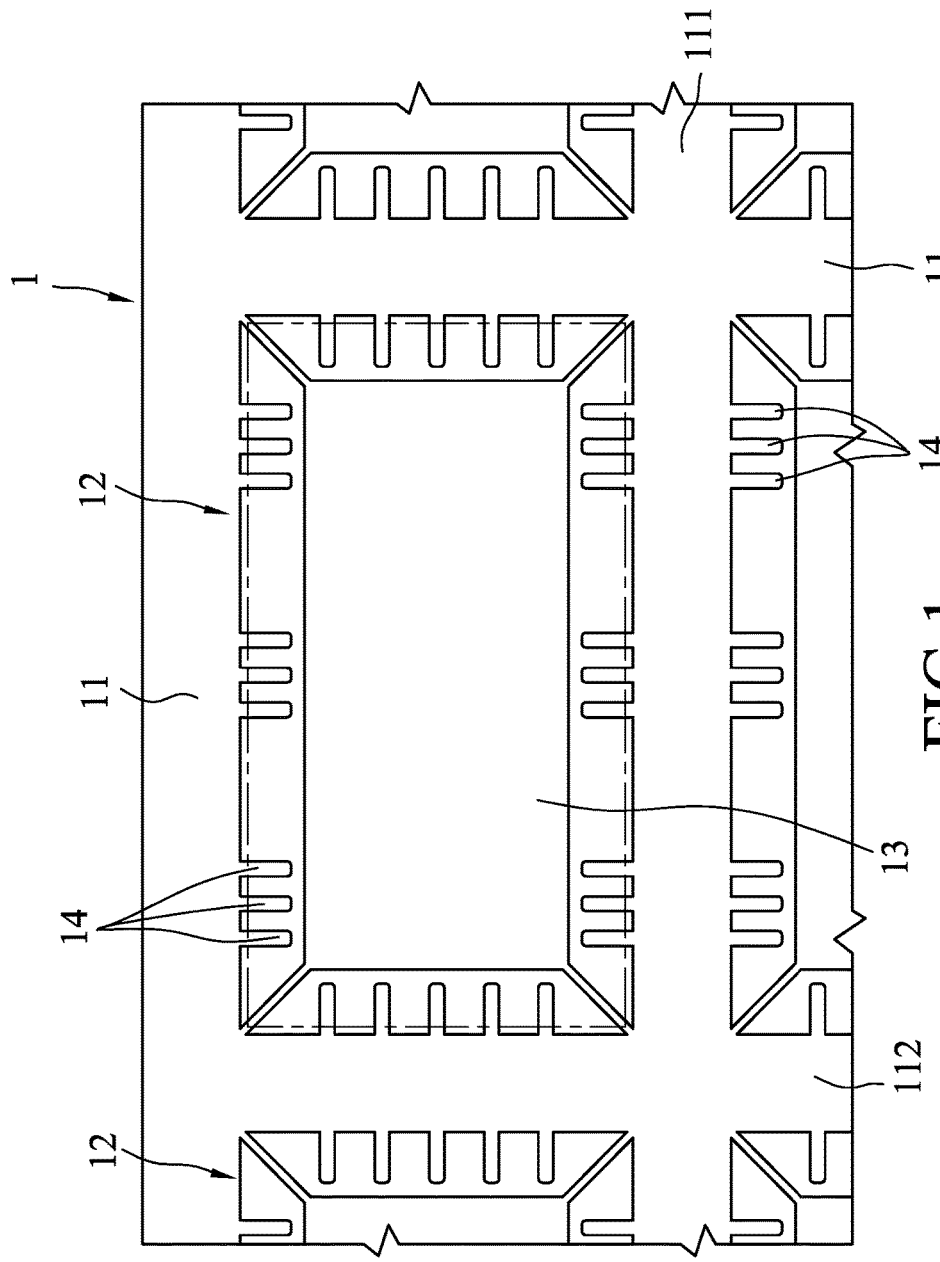
FIG. 1 is a schematic view illustrating lead frame units of a conventional quad flat no-lead package.
Figure 2:
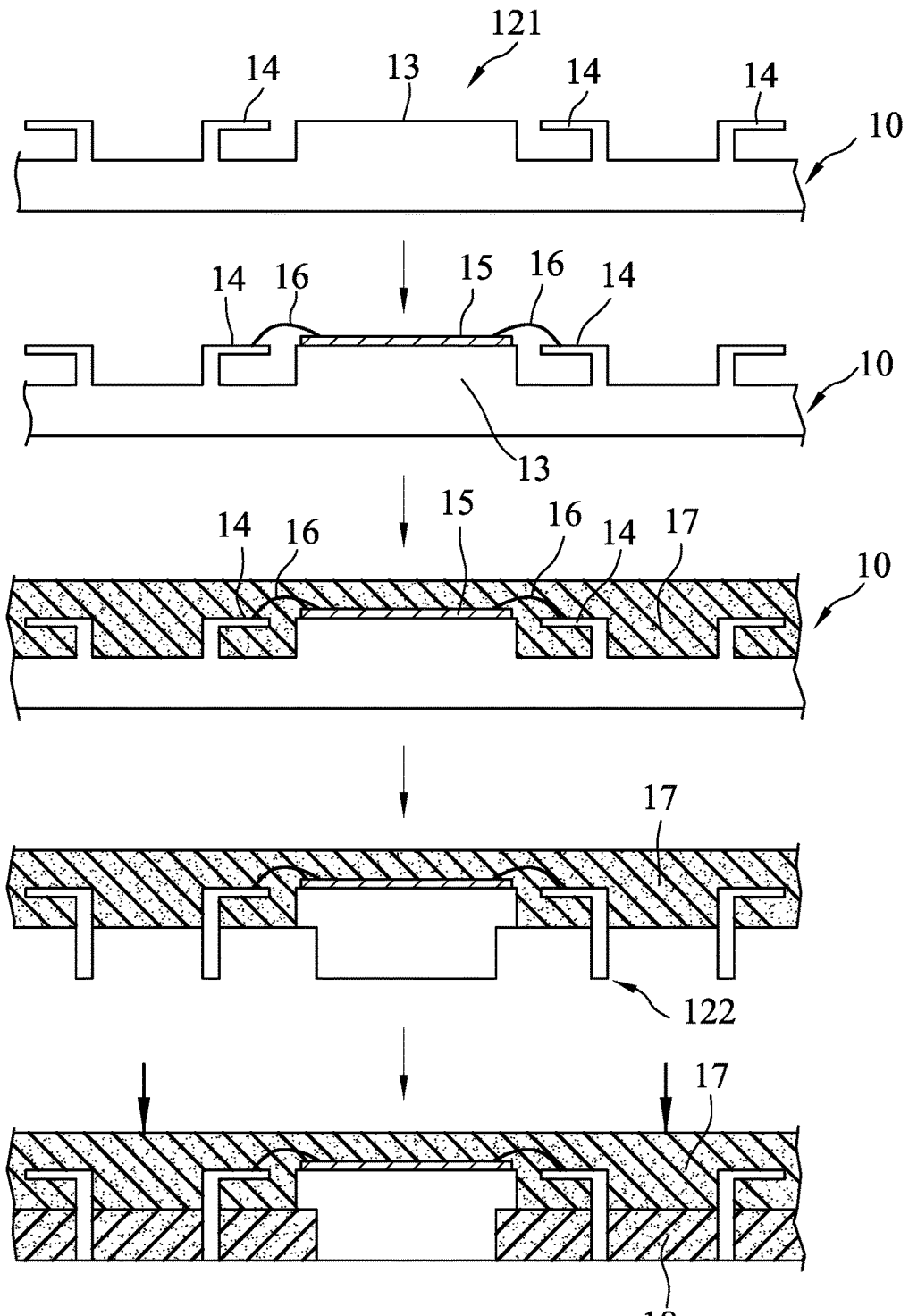
FIG. 2 is a schematic view illustrating consecutive steps of a method of making a conventional grid quad flat no-lead (GQFN) package.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
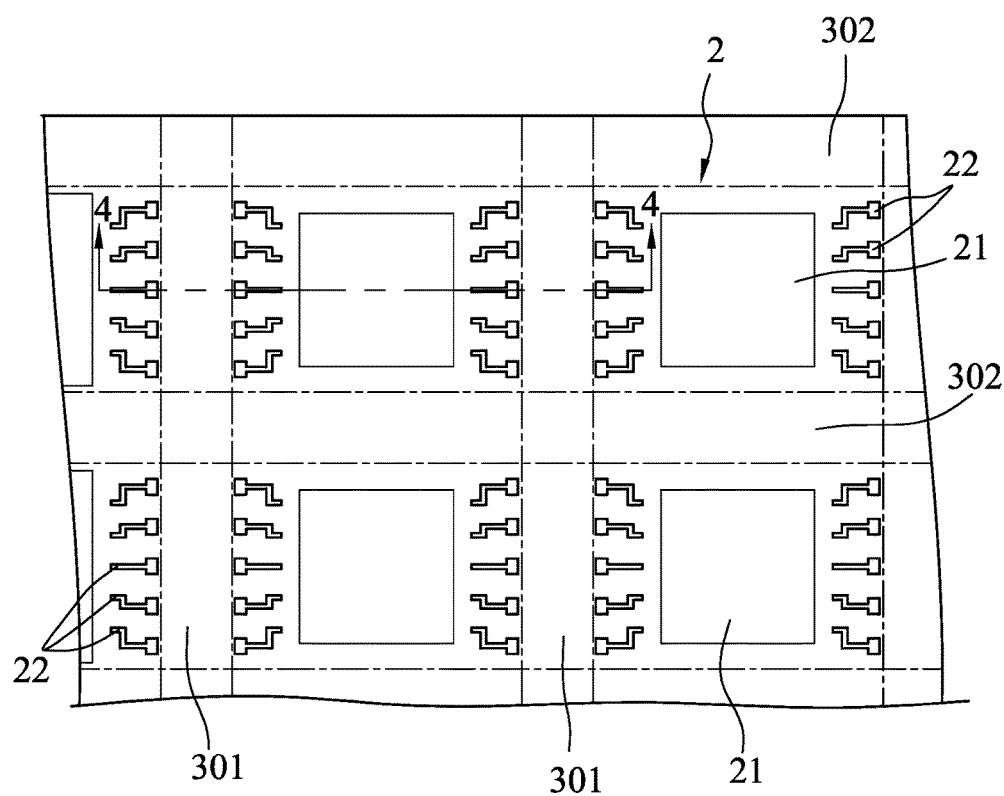
FIG. 3 is a fragmentary and schematic top view illustrating an embodiment of a molded lead frame device according to the disclosure.
Figure 4:
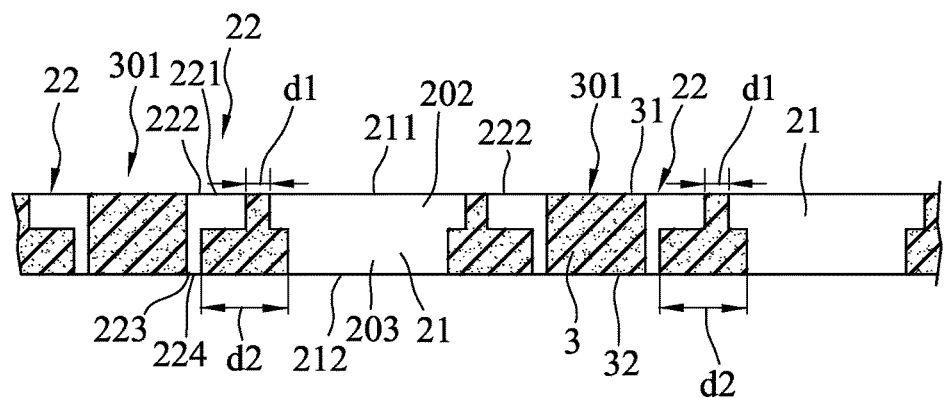
FIG. 4 is a fragmentary cross-sectional view taken along line 4-4 of FIG. 3.

Referring to FIGS. 3 to 4, an embodiment of a molded lead frame device 200 according to the disclosure applicable to formation of semiconductor packages is illustrated. The molded lead frame device 200 includes a plurality of lead frame units 2, and a molding layer 3.

The lead frame units 2 are made of one of copper, a copper-based alloy, an iron-nickel based alloy and combinations thereof. Each of the lead frame units 2 includes a die pad 21, and an array of leads 22. The die pad 21 of each of the lead frame units 2 has a die supporting portion 202, and a base portion 203 connected to the die supporting portion 202. The array of leads 22 of each of the lead frame units 2 surrounds and is spaced apart from the die pad 21. Each of the leads 22 of the lead frame units 2 includes a die-connecting portion 221 that extends toward and is spaced apart from the die supporting portion 202 of the die pad 21 of a corresponding one of the lead frame units 2, and a terminal portion 223 that extends downwardly from the die-connecting portion 221.

The molding layer 3 embeds the lead frame units 2 and has spaced apart longitudinal and transverse sections 301, 302 interconnecting each other and separating the lead frame units 2 from each other. Thus, the lead frame units 2 are arranged in an array, and spaced apart and electrically disconnected from each other.

Figure 5:
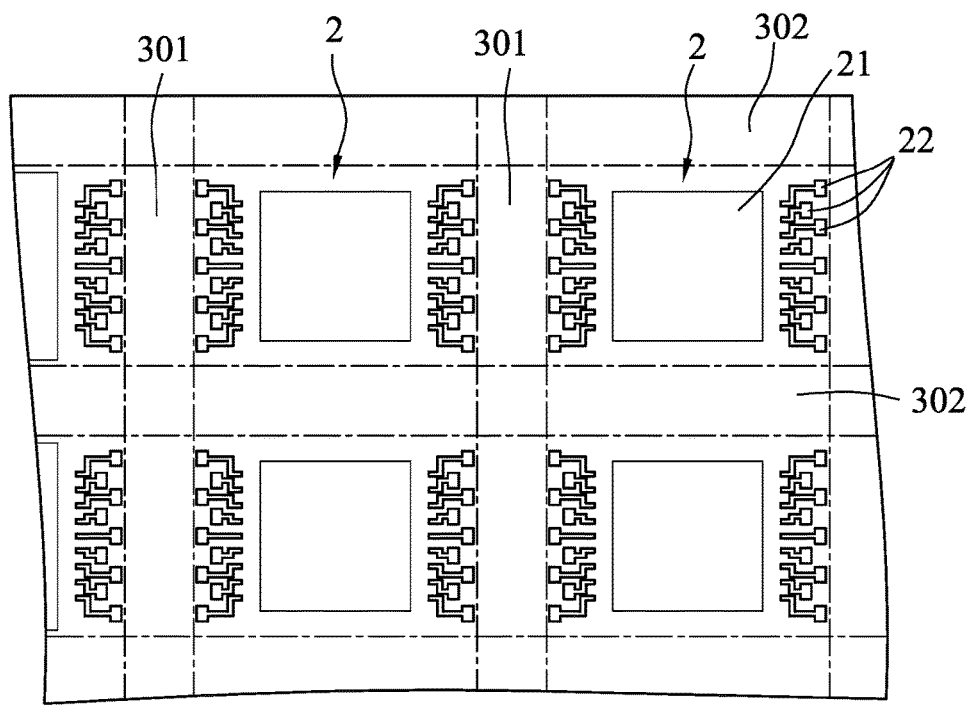
FIG. 5 is a fragmentary and schematic top view illustrating a modification of the embodiment of the molded lead frame device.

More specifically, the die supporting portion 202 and the base portion 203 of the die pad 21 of each of the lead frame units 2 respectively have a top surface 211 and a bottom surface 202 that are opposite to each other. The die-connecting portion 221 and the terminal portion 222 of each of the leads 22 of each of the lead frame units 2 respectively have a top surface 222 and a bottom surface 224 that are opposite to each other. In each of the lead frame units 2, the top surface 211 of the die pad 21 is flush with the top surfaces 222 of the leads 22. The terminal portions 223 of the leads 22 of the lead frame units 2 can be electrically connected to an external electric power. It is noted that in this embodiment, the die pad 21 of each of the lead frame units 2 is exemplified to be one, but not limited to be one in practice use. The leads 22 of each of the lead frame unit 2 may have different arrangements. For example, the leads 22 adjacent to either one of the longitudinal sections 301 can be registered with each other in a form of one or more columns. As shown in FIG. 5, the leads 22 adjacent to either one of the longitudinal sections 301 are exemplified to be arranged into two columns. Similarly, the leads 22 adjacent to the transverse sections 302 can be registered with each other in a form of one or more rows.

The molding layer 3 is made of a polymeric material, such as epoxy resin, etc., and fills gap among the die pads 21 and the leads 22 of the lead frame units 2. In one form, the molding layer 3 further has a top face 31 and a bottom face 32. The top face 31 uncovers top surfaces 211 of the die supporting portions 202 of the die pads 21 of the lead frame units 2 and the top surfaces 222 of the die-connecting portions 221 of the leads 22 of the lead frame units 2, so that the top face 31 of the molding layer 3 is flush with the top surfaces 211 of the die pads 21 and the top surfaces 222 of the die-connecting portions 221 of the leads 22. The bottom face 32 uncovers bottom surfaces 212 of the base portions 203 of the die pads 21 and the bottom surfaces 224 of the terminal portions 223 of the leads 22.

More specifically, the molding layer 3 includes an upper molding layer 106 embedding the die supporting portions 202 of the die pads 21 of the lead frame units 2 and the die-connecting portions 221 of the leads 22 of the lead frame units 2. Alternatively, the molding layer 3 further includes a lower molding layer 108 embedding the base portions 203 of the die pad 21 of each of the lead frame units 2 and the terminal portions 223 of the leads 22 of the lead frame units 2. The upper molding layer 106 and the lower molding layer 108 may be made from identical or different curable resin materials.

In one form, each of the lead frame units 2 may be free of the die pad 21, and the chips (W) may be respectively connected to the leads 22 using flip-chip techniques, etc.

In one form, for each of the lead frame units 2, the die-connecting portions 221 of the leads 22 are spaced apart from the die supporting portion 202 of the die pad 21 by a first distance (d1), and the terminal portions 223 of the leads 22 are spaced apart from the base portion 203 of the die pad 21 by a second distance (d2). The first distance (d1) is smaller than the second distance (d2).

Figure 6:
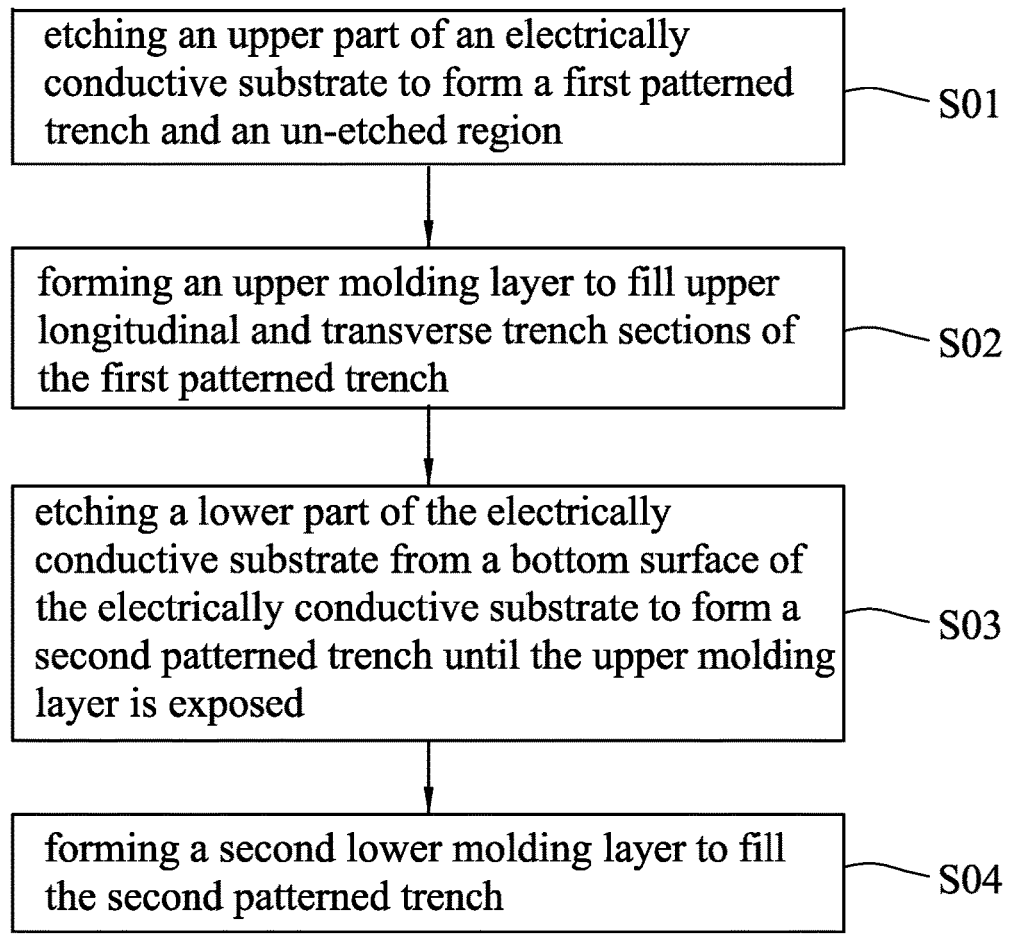
FIG. 6 is a flow chart illustrating a method of making the embodiment of the molded lead frame device.
Figure 7:
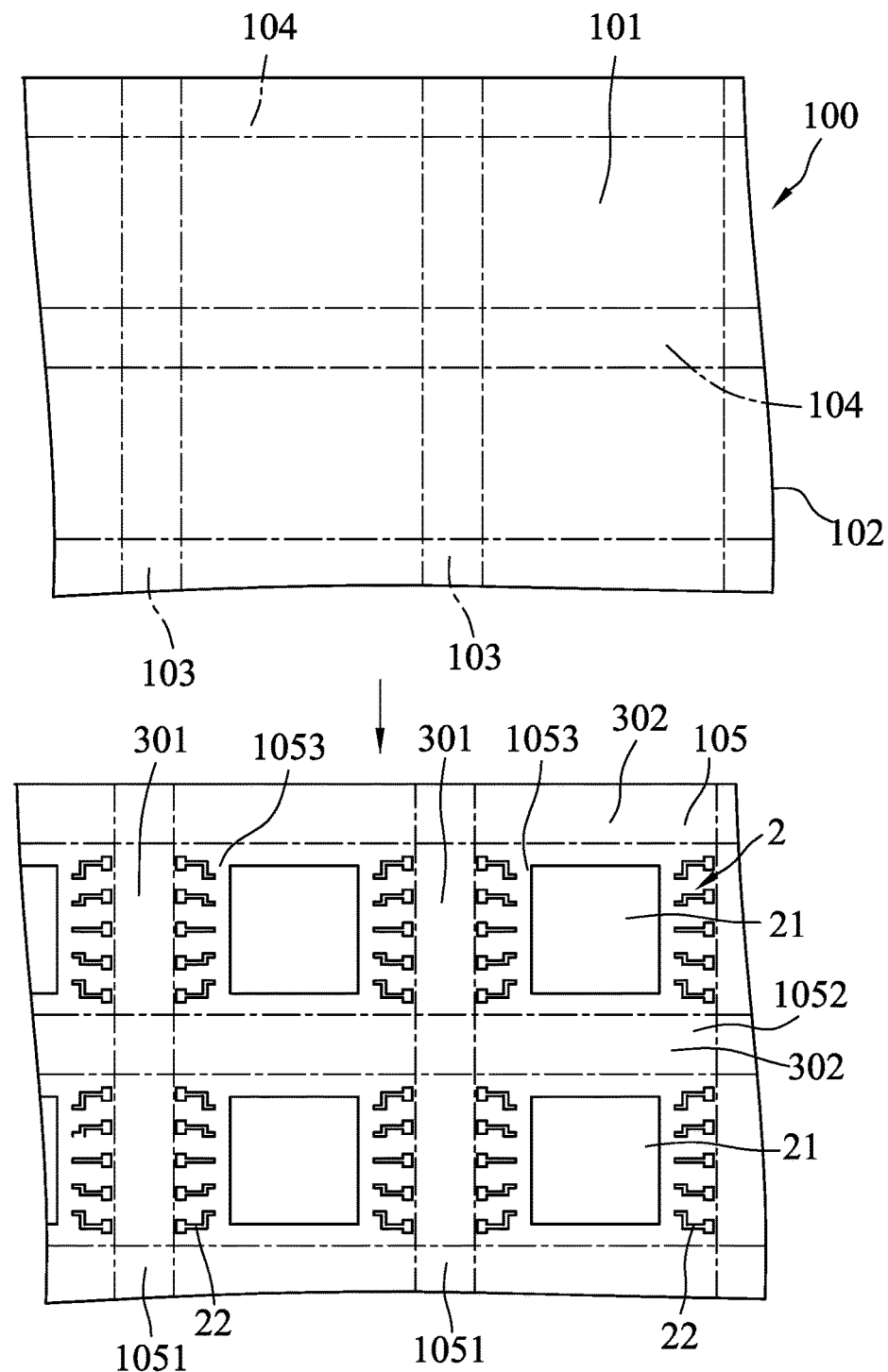
FIG. 7 is a fragmentary and schematic view illustrating the step of etching an upper part of an electrically conductive substrate of the method illustrated in FIG. 6.
Figure 8:
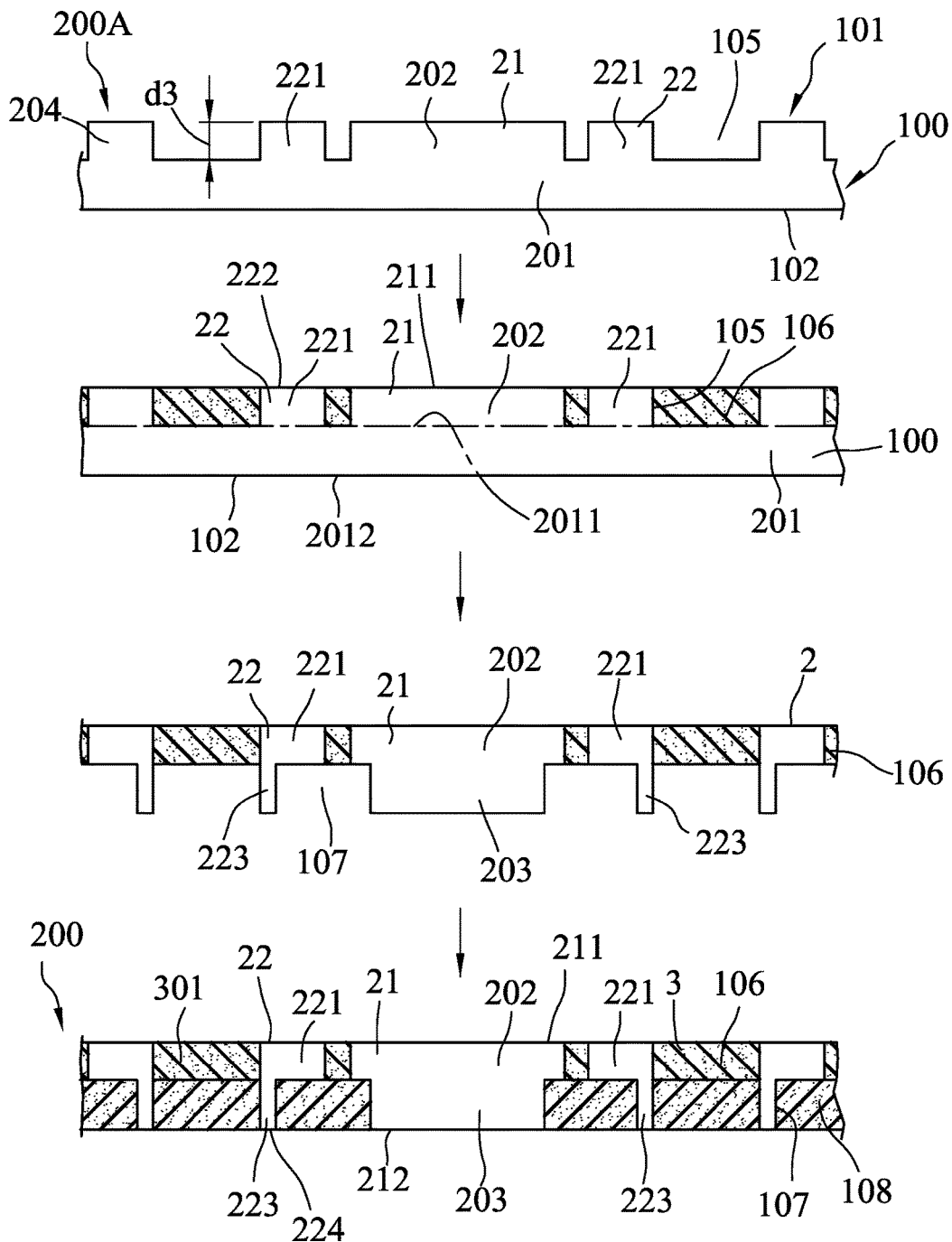
FIG. 8 is a fragmentary cross-sectional view illustrating consecutive steps of the method illustrated in FIG. 6.

Referring to FIGS. 6, 7 and 8, a method of making the embodiment of the molded lead frame device (200) is illustrated and includes steps S01 to S04.

Figure 9:
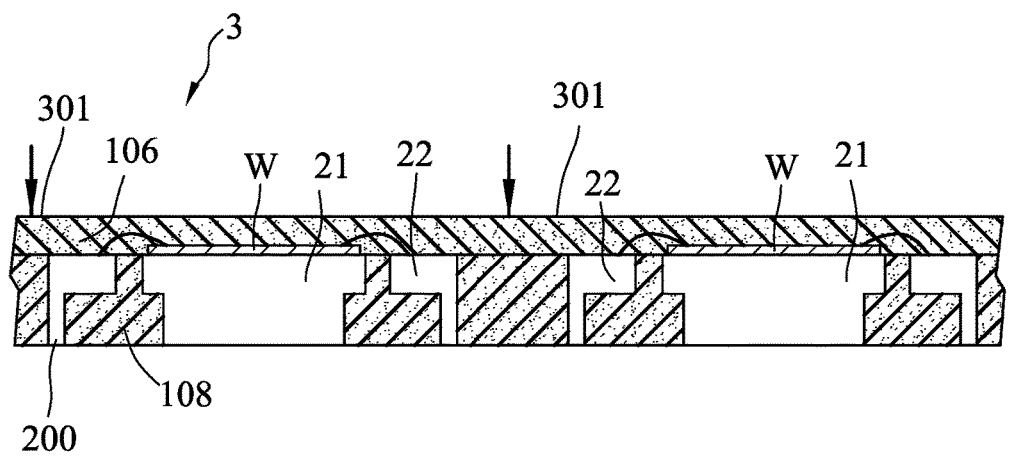
FIG. 9 is a fragmentary and schematic cross-sectional view illustrating semiconductor packages formed from the embodiment of the molded lead frame device.

In step S01, an electrically conductive substrate 100 is first prepared. More specifically, the electrically conductive substrate 100 includes a top surface 101 to be in contact with the semiconductor chip (W) (as shown in FIG. 9) and a bottom surface 102 that is opposite to the first surface 101, and is defined with longitudinal and transverse imaginary sections 103, 104 interconnecting each other and corresponding in position to the longitudinal and transverse sections 301, 302 of the molding layer 3 that are subsequently formed (as shown in FIG. 3). In one form, the electrically conductive substrate 100 may be made of a metal sheet, such as copper, a copper-based alloy, an iron-nickel-based alloy and combinations thereof. In another form, the electrically conductive substrate 100 may be, but not limited to be, a layered structure, such as a copper-nickel-palladium triple-stacked structure formed by plating a nickel layer on a copper sheet and then plating a palladium layer on the nickel layer. In the embodiment, the electrically conductive substrate 100 is a single-layered copper sheet and has a thickness ranging from 1.0 mm to 1.5 mm.

Then, an upper part 204 of the electrically conductive substrate 100 is etched from the top surface 101 to form a first patterned trench 105. The first patterned trench 105 is indented from the top surface 101 of the electrically conductive substrate 100 and does not extend into a lower part 201 of the electrically conductive substrate, such that an un-etched region of the electrically conductive substrate 100 includes the die pads 21, and the arrays of the leads 22. Each array of the leads 22 surrounds at least one of the die pads 21 in a spaced apart manner. The first patterned trench 105 includes a plurality of spaced apart upper longitudinal and transverse trench sections 1051, 1052 that intersect each other, that separate the die pads 21 from each other, and that correspond in position to the longitudinal and transverse imaginary sections 103, 104, and a plurality of gaps 1053 that are formed among the leads 22 and the die pads 21. In the embodiment, an un-etched region of the upper part 204 includes the die supporting portions 202 of the die pads 21, and the die-connecting portions 221 of the leads 22. In one form, the first patterned trench 105 has a depth (d3) measured from the top surface 101 of the electrically conductive substrate 100 to the bottom surface 102 of not greater than half of the distance measured from the top surface 101 to the bottom surface 102 of the electrically conductive substrate 100, so that the die supporting portions 202 of the die pads 21 and the die-connecting portions 221 of the leads 22 can be formed relatively precisely. In one form, the depth (d3) of the first patterned trench 105 is not greater than 0.5 mm.

In step S02, the upper molding layer 106 is formed to fill the upper longitudinal and transverse trench sections 1051, 1052 and the gaps 1053 without covering the top surfaces 211 of the die pads 21 and the top surfaces 222 of the leads 22. More specifically, the electrically conductive substrate 100 formed with the first patterned trench 105 is disposed in a mold (not shown), and then an encapsulating material selected from an insulating material, such as epoxy resin, is filled in the first patterned trench 105 without covering the top surfaces 202 of the die pads 21 and the top surfaces 222 of the leads 22, followed by curing of the encapsulating material to form the upper molding layer 106.

In step S03, the lower part 201 of the electrically conductive substrate 100 is etched from the bottom surface 102 of the electrically conductive substrate 100 to form the second patterned trench 107 until the upper molding layer 106 is exposed. The un-etched region of the lower part 201 includes a part of each of the die pads 21 and a part of each of the leads 22 extending from the un-etched region of the upper part 204 to the bottom surface 102 of the electrically conductive substrate 100. More specifically, the un-etched region of the lower part 201 includes the base portions 203 of the die pads and the terminal portions 223 of the leads 22 that are spaced apart from each other.

In step S04, the lower molding layer 108 is formed to fill the second patterned trench 107 without covering the bottom surfaces 212, 224 of the die pads 21 and the leads 22, so that the molded lead frame device 200 is thus formed (as shown in FIG. 3).

More specifically, the electrically conductive substrate 100 formed with the second patterned trench 107 is disposed in a mold (not shown), and then an encapsulating material selected from an insulating material, such as epoxy resin, is filled in the second patterned trench 107 without covering the bottom surfaces 212 of the die pads 21 and the bottom surfaces 224 of the leads 22, followed by curing of the encapsulating material to form the lower molding layer 108. In the embodiment, the upper molding layer 106 and the lower molding layer 108 are compatible with each other and may be made of different materials so as to cooperatively define the molding layer 3 of the molded lead frame units 200.

In addition, the step S04 may be omitted based on actual practice, so that the molding layer 3 is only composed of the upper molding layer 106.

By virtue of two etching steps, the leads 22, such as the die-connecting portions 221, and the die pads 21 can be formed relatively precisely. Particularly, the etching operation performed in step S01 involves formation of the first pattern trench 105 with relatively high precision, while the etching operation performed in step S03 involves formation of the second pattern trench 107 with relatively low precision. The formation of the upper molding layer 106 contributes to preserving precision of the first pattern trench 105. Therefore, the quality of the molded lead frame device 200 thus formed can be improved. In addition, since the molding layer 3 is made from the electrically insulating material, the lead frame units 2 are electrically disconnected from each other.

Referring to FIG. 9, after the formation of the second molded layer 108, the semiconductor chips (W) are respectively disposed on the die pads 21, and each of the semiconductor chips (W) is then wire bonded to the corresponding array of the leads 22, followed by encapsulating the die pads 21 and the array of the leads 22. Thereafter, the upper and lower molding layers 106, 108 are cut along the upper longitudinal and transverse sections 301, 302 (as shown in FIG. 5) by a dicing blade so as to form the semiconductor packages. Hence, electrical tests of the semiconductor packages can be conducted prior to the cutting step. Besides, the dicing operation is carried out along the upper longitudinal and transverse sections 301 made of polymeric materials and damage to the dicing blades caused by dicing metal materials can be avoided.

Figure 10:
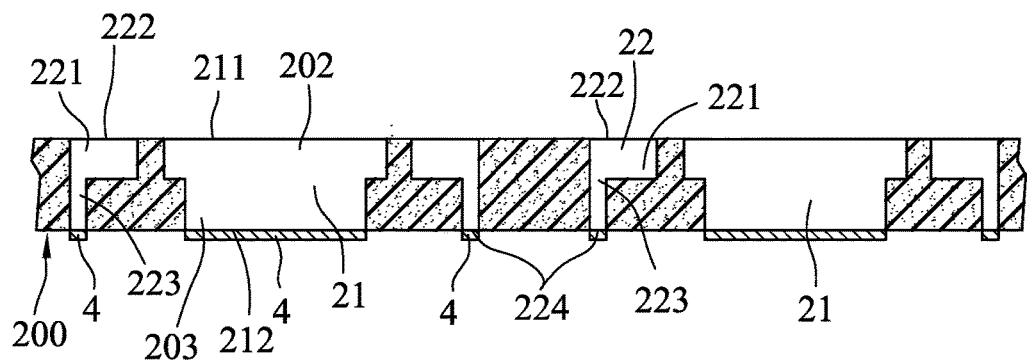
FIG. 10 is a variation of the embodiment of the molded lead frame device.

Referring to FIG. 10, another configuration of the embodiment of the molded lead frame device 200 further includes a metal layer 4 that is formed on the bottom surfaces 212 of the base portions 203 of the die pads 21 and the bottom surfaces 224 of the terminal portions 223 of the leads 22. The metal layer 4 may be a single layer or a layered structure, and may be made from a metal material selected from nickel, palladium, silver, etc. Therefore, the reliability of the semiconductor packages in subsequent processing, such as electrical connection, soldering and wire-bonding, can be improved. In one form, the metal layer 4 may be further formed on the top surfaces 211 of the die supporting portions 202 of the die pads 21 and the top surfaces 222 of the die-connecting portions 221 of the leads 22.

Figure 11:
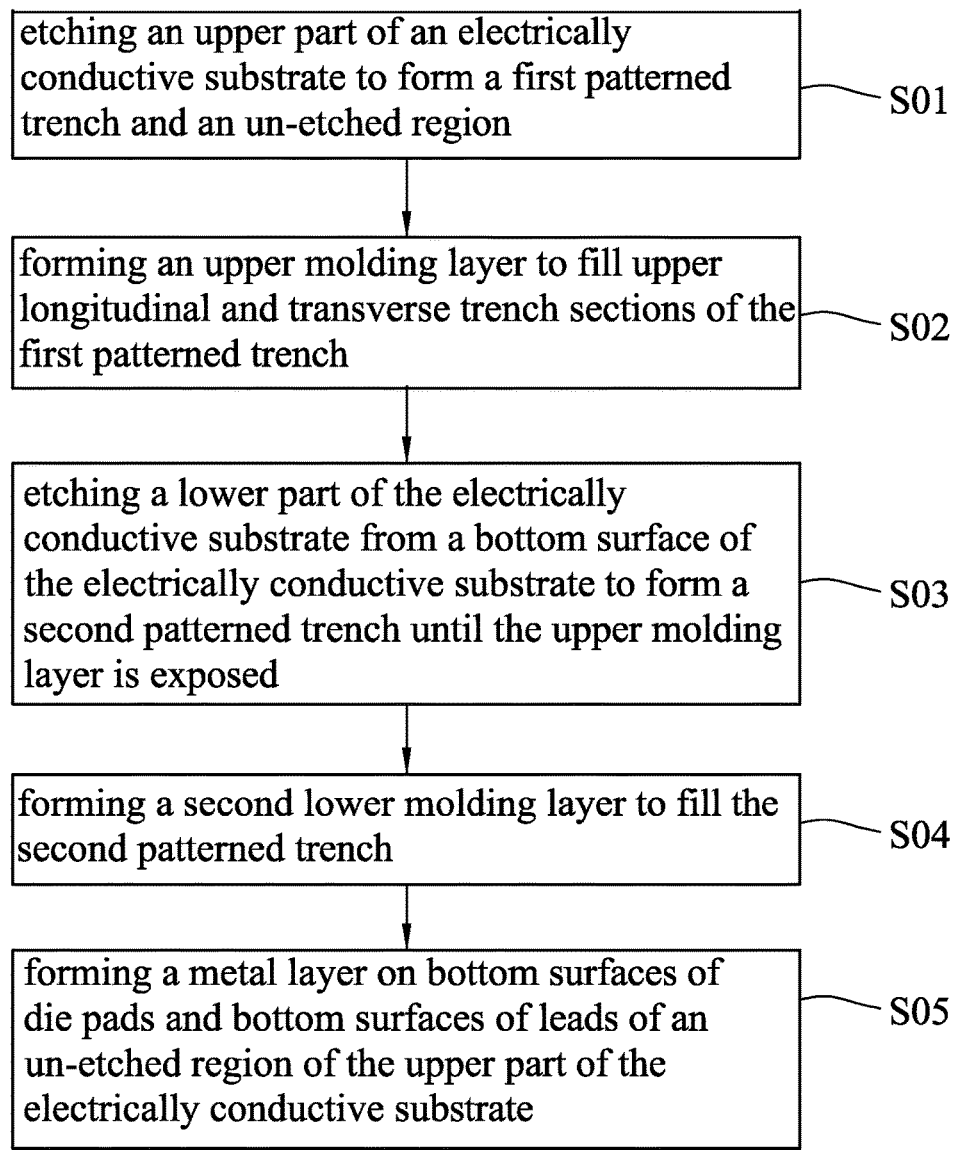
FIG. 11 is a flow chart illustrating consecutive steps of a method of making the variation of the embodiment of the molded lead frame device.

Further referring to FIG. 11, a method of making the configuration of the molded lead frame device 200 of FIG. 10 further includes a step of forming the metal layer 4 on the bottom surfaces 212 of the die pads 21 and the bottom surfaces 224 of the leads 22 using electroless-plating techniques or sputtering techniques in addition to steps S01 to S04 shown in FIG. 6. In addition, the metal layer 4 may be formed on the top surfaces 211 of the die supporting portions 202 of the die pads 21 and the top surfaces 222 of the die-connecting portions 221 of the leads 22 using the electroless-plating techniques or the sputtering techniques. Since the electroless-plating techniques or the sputtering techniques are well known to those skilled in the art, further details thereof are not provided herein for the sake of brevity.

The metal layer 4 formed on the bottom surfaces 224 of the terminal portions 223 of the leads 22 and the bottom surfaces 212 of the base portions 203 of the die pads 21 can be directly welded to or electrically connected to an external electric component, such as a circuit board.

In summary, by virtue of two etchings steps in cooperation with the step of forming the molding layer 3, the lead frame units 2 of the molded lead frame device 200 thus formed are electrically isolated. Therefore, the following processes, such as the dicing process or the encapsulating process, can be conducted relatively efficiently. Furthermore, by virtue of the formation of the metal layer 4, the molded lead frame device 200 can be electrically connected to the external device conveniently.

The following examples pertain to further embodiments of the disclosure. Example 1 is directed to a method of making a molded lead frame device, comprising: etching an upper part of an electrically conductive substrate to form a first patterned trench that is indented from a top surface of the electrically conductive substrate and that does not extend into a lower part of the electrically conductive substrate, wherein an un-etched region includes a plurality of die pads, and a plurality of arrays of leads, each array of which surrounds at least one of the die pads in a spaced apart manner, and wherein the first patterned trench includes a plurality of spaced apart upper longitudinal and transverse trench sections that intersect each other and that separate the die pads from each other, and a plurality of gaps formed among the leads and the die pads; forming an upper molding layer to fill the upper longitudinal and transverse trench sections and the gaps without covering top surfaces of the die pads and top surfaces of the leads; and etching a lower part of the electrically conductive substrate from a bottom surface of the electrically conductive substrate to form a second patterned trench until the upper molding layer is exposed, and an un-etched region that includes a part of each of the die pads and a part of each of the leads extending from the un-etched region of the upper part to the bottom surface of the electrically conductive substrate.

Example 2 is directed to the method of making a molded lead frame device of Example 1, further comprising forming a lower molding layer to fill the second patterned trench without covering the bottom surfaces of the die pads and the bottom surfaces of the leads.

Example 3 is directed to the method of making a molded lead frame device of Example 2, further comprising forming a metal layer on the bottom surfaces of the die pads and the bottom surfaces of the leads.

Example 4 is directed to the method of making a molded lead frame device of Example 3, wherein: the top surfaces of the die pads and the leads are flush with a top face of the upper molding layer.

Example 5 is directed to a method of making semiconductor packages from a molded lead frame device obtained from the method of Example 1, comprising: disposing a semiconductor chip on each of the die pads after the lower molding layer is formed, wire bonding the semiconductor chip to the corresponding array of the leads, encapsulating the die pads and the array of the leads, and cutting the upper and lower molding layers along the upper longitudinal and transverse trench sections to form the semiconductor packages.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A molded lead frame device, comprising:
    a plurality of lead frame units each including an array of leads, each of said leads including a die-connecting portion, and a terminal portion that extends downwardly from said die-connecting portion; and
    a molding layer that embeds said die-connecting portions of said lead frame units and that has spaced apart longitudinal and transverse sections intersecting each other and separating said lead frame units from each other,
    wherein said molding layer has an upper molding layer embedding said die-connecting portions and a lower molding layer extending from said upper molding layer and embedding said terminal portions; and
    wherein each of said lead frame units further includes a die pad that is surrounded by and spaced apart from said leads and that has a die supporting portion, and a base portion connected to said die supporting portion, said die-connecting portion of each of said leads extending toward and spaced apart from said die supporting portion of said die pad.

2. The molded lead frame device of claim 1, wherein said molding layer further includes a top face that uncovers top surfaces of said die supporting portions of said die pads of said lead frame units and top surfaces of said die-connecting portions of said leads of said lead frame units, and a bottom face that uncovers bottom surfaces of said base portions of said die pads and bottom surfaces of said terminal portions of said leads.

3. The molded lead frame device of claim 2, further comprising a metal layer formed on said bottom surfaces of said base portions of said die pads and said bottom surfaces of said terminal portions of said leads.

4. The molded lead frame device of claim 2, wherein for each of said lead frame units, said die-connecting portions of said leads are spaced apart from said die supporting portion of said die pad by a first distance, and said terminal portions of said leads are spaced apart from said base portion of said die pad by a second distance, the first distance being smaller than the second distance.

5. The molded lead frame device of claim 2, wherein said die supporting portions of said die pads of said lead frame units are embedded in said upper molding layer of said molding layer, said base portions of said die pads being embedded in said lower molding layer.

6. The molded lead frame device of claim 1, wherein said upper and lower molding layers are formed from different curable resin materials.

* * * * *